(12) United States Patent
Abiko et al.

(10) Patent No.: US 9,496,042 B1
(45) Date of Patent: Nov. 15, 2016

(54) SEMICONDUCTOR DEVICE WITH CONTROL OF MAXIMUM VALUE OF CURRENT CAPABLE OF BEING SUPPLIED

(71) Applicant: Kabushiki Kaisha Toshiba, Minato-ku (JP)

(72) Inventors: Naofumi Abiko, Kawasaki (JP); Masahiro Yoshihara, Yokohama (JP); Yoshihiko Kamata, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/840,174

(22) Filed: Aug. 31, 2015

Related U.S. Application Data

(60) Provisional application No. 62/164,806, filed on May 21, 2015.

(51) Int. Cl.
| | |
|---|---|
| *G11C 5/14* | (2006.01) |
| *G11C 16/10* | (2006.01) |
| *G11C 16/30* | (2006.01) |
| *G11C 16/26* | (2006.01) |
| *G11C 7/06* | (2006.01) |
| *G11C 16/34* | (2006.01) |
| *G11C 5/02* | (2006.01) |
| *G11C 5/06* | (2006.01) |
| *H01L 25/065* | (2006.01) |
| *H01L 23/48* | (2006.01) |

(52) U.S. Cl.
CPC ............... *G11C 16/10* (2013.01); *G11C 5/025* (2013.01); *G11C 5/063* (2013.01); *G11C 7/06* (2013.01); *G11C 16/26* (2013.01); *G11C 16/30* (2013.01); *G11C 16/3459* (2013.01); *H01L 23/481* (2013.01); *H01L 25/0657* (2013.01); *G11C 5/14* (2013.01); *G11C 5/147* (2013.01); *H01L 2225/06541* (2013.01)

(58) Field of Classification Search
CPC ........................................................ G11C 5/14
USPC ............................................................ 365/226
See application file for complete search history.

(56) References Cited

U.S. PATENT DOCUMENTS

| | | | | |
|---|---|---|---|---|
| 7,957,217 | B2 * | 6/2011 | Park ...................... | G11C 5/147 365/189.08 |
| 8,565,027 | B2 * | 10/2013 | Kim ...................... | G11C 5/143 365/189.07 |
| 8,638,006 | B2 * | 1/2014 | Im ........................... | G05F 1/56 307/18 |
| 8,913,443 | B2 * | 12/2014 | Pyeon ................. | H01L 25/0657 365/189.07 |
| 8,937,488 | B2 * | 1/2015 | Riho .............. | H03K 19/018521 326/21 |
| 9,251,868 | B2 * | 2/2016 | Fukushi ................. | G11C 5/147 |
| 2003/0062612 | A1 | 4/2003 | Matsuo et al. | |
| 2005/0082664 | A1 * | 4/2005 | Funaba .................. | H01L 23/544 257/724 |
| 2012/0248600 | A1 | 10/2012 | Shigezane et al. | |
| 2013/0162282 | A1 * | 6/2013 | Hatakeyama ........... | H01L 22/30 324/762.01 |

FOREIGN PATENT DOCUMENTS

| | | |
|---|---|---|
| JP | 2003-110086 | 4/2003 |
| JP | 2012-209497 | 10/2012 |
| JP | 2014-41869 | 3/2014 |

\* cited by examiner

*Primary Examiner* — Son Mai
(74) *Attorney, Agent, or Firm* — Oblon, McClelland, Maier & Neustadt, L.L.P.

(57) ABSTRACT

According to one embodiment, a semiconductor device includes: a first semiconductor chip including a first via and a second via; and a second semiconductor chip including a third via and a fourth via and being located above the first semiconductor chip. The first semiconductor chip includes: a first detector capable of coupling to the third via through the second and fourth vias; and a first current source configured to control an output current in accordance with a voltage of the third via detected by the first detector.

32 Claims, 11 Drawing Sheets

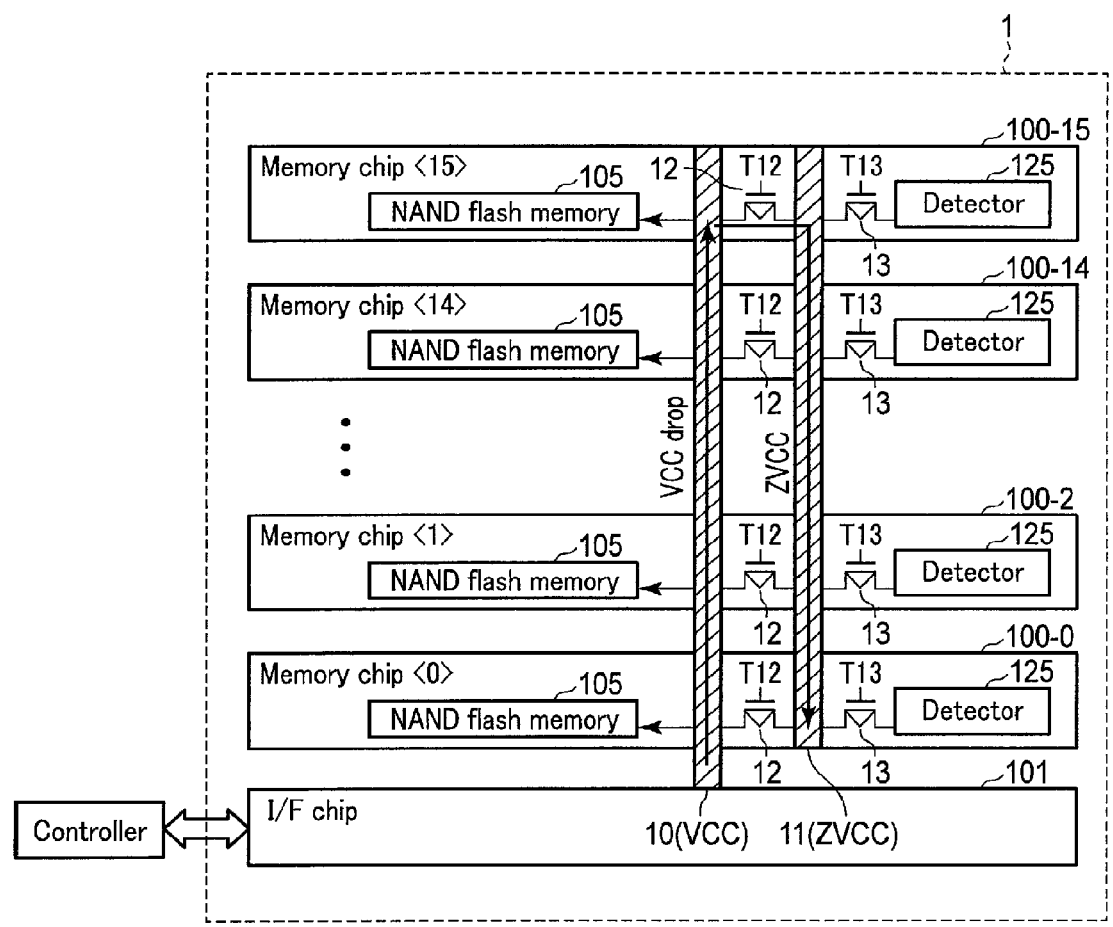
F I G. 1

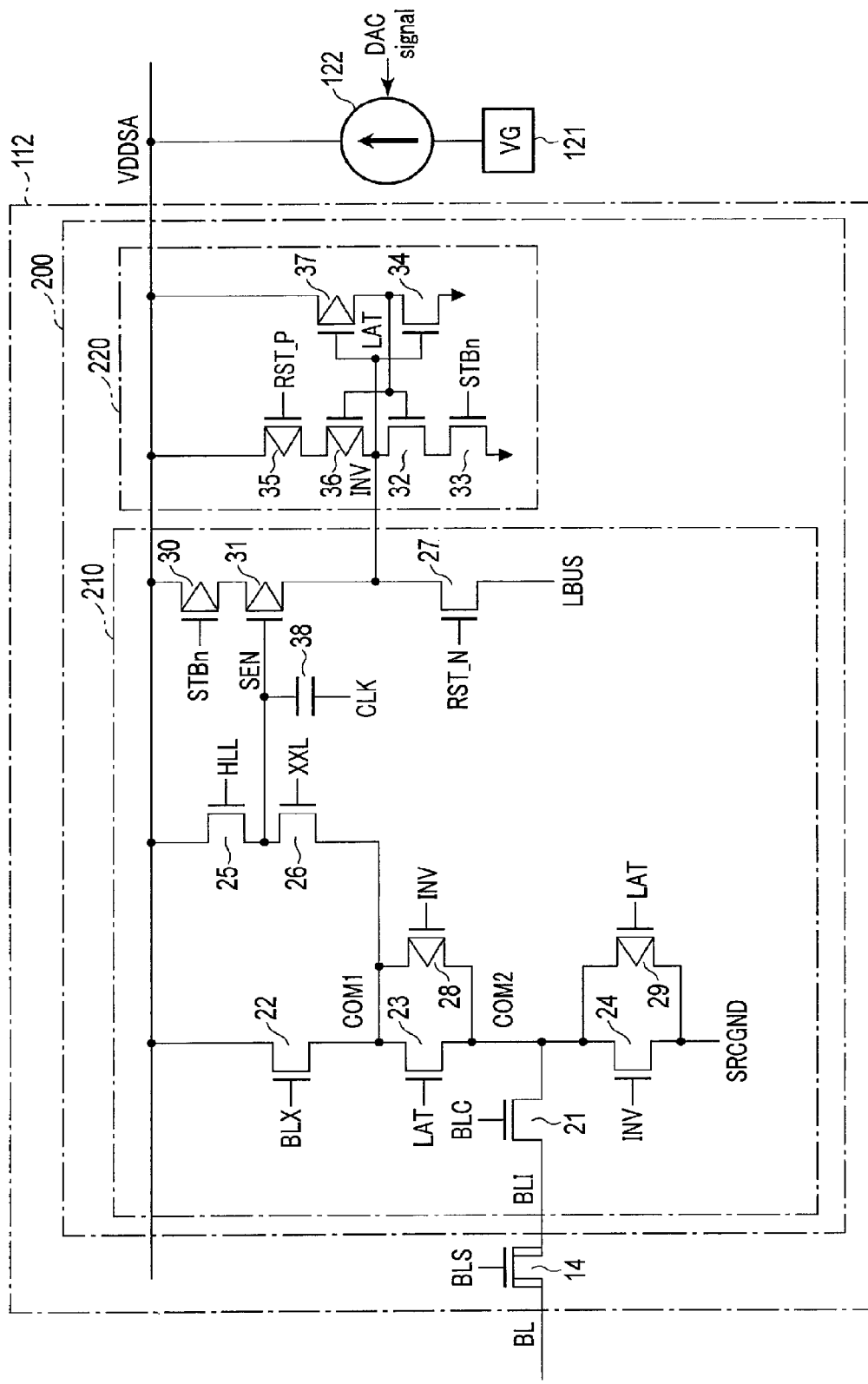
F I G. 5

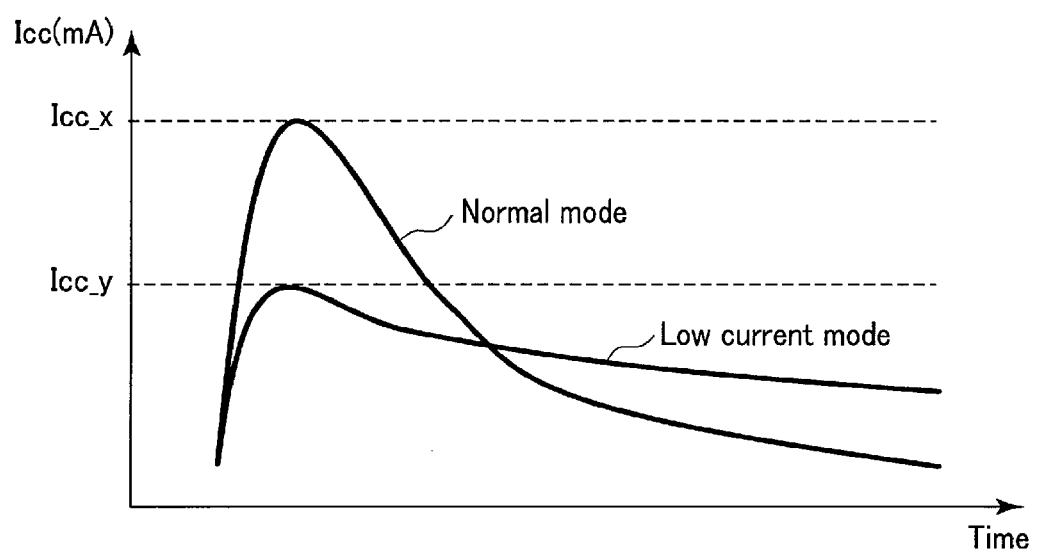
F I G. 6

US 9,496,042 B1

SEMICONDUCTOR DEVICE WITH CONTROL OF MAXIMUM VALUE OF CURRENT CAPABLE OF BEING SUPPLIED

CROSS-REFERENCE TO RELATED APPLICATIONS

This application claims the benefit of U.S. Provisional Application No. 62/164,806, filed May 21, 2015, the entire contents of which are incorporated herein by reference.

FIELD

Embodiments described herein relate generally to a semiconductor device.

BACKGROUND

A semiconductor device is known which includes a plurality of memory chips with through silicon vias (TSV).

BRIEF DESCRIPTION OF THE DRAWINGS

FIG. 1 is a cross-sectional view of a semiconductor device of an embodiment;

FIG. 5 is a circuit diagram of a sense amplifier provided in the semiconductor device of the embodiment;

FIG. 6 is a graph illustrating an example of current consumption in a program operation in the semiconductor device of the embodiment;

DETAILED DESCRIPTION

Figure 2:
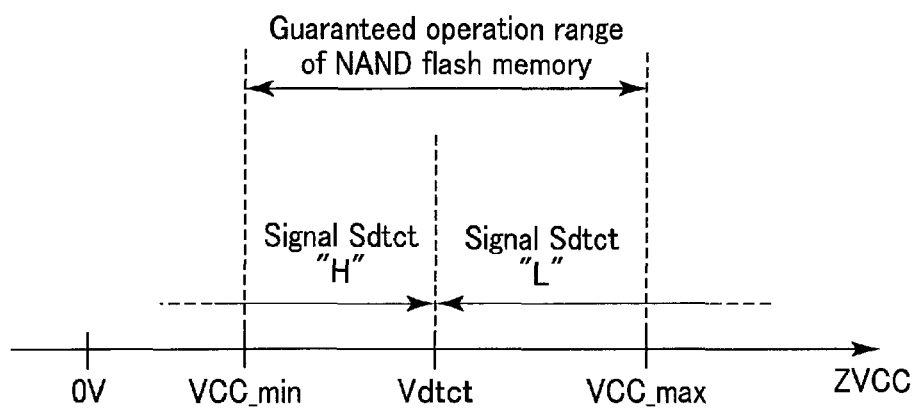
FIG. 2 is a graph illustrating a voltage detection level of a voltage detector provided in the semiconductor device of the embodiment.

In general, according to one embodiment, a semiconductor device includes: a first semiconductor chip including a first via and a second via; and a second semiconductor chip including a third via coupled to the first via and a fourth via coupled to the second via and the third via, the second semiconductor chip being located above the first semiconductor chip. The first semiconductor chip includes: a first detector capable of coupling to the third via through the second and fourth vias; and a first current source configured to control an output current in accordance with a voltage of the third via detected by the first detector.

An embodiment will be described below, taking as an example, a semiconductor device in which a plurality of memory chips with NAND flash memories is stacked and connected together by means of through silicon vias.

1 Configuration

First, a configuration of a semiconductor device of an embodiment will be described.

1.1 General Configuration of the Semiconductor Device

FIG. 1 is a sectional view of the semiconductor device according to the present embodiment. As depicted in FIG. 1, the semiconductor device 1 of the present embodiment includes an interface chip 101 and 16 stacked memory chips 100 (100-0 to 100-15). The number of memory chips 100 is not limited to 16 but may be eight, four, etc. No limitation is imposed on the number of memory chips. The semiconductor device 1 is supplied with a voltage VCC by an external controller, and operates using the voltage VCC as a power supply voltage. Moreover, operations of the semiconductor device 1 such as data write, read, and erase are controlled by commands transmitted from the controller.

The interface chip 101 connects the external controller and the memory chips 100 together.

The memory chip 100 includes through silicon vias (TSV) 10 and 11, p-channel MOS transistors 12 and 13, a voltage detector 125, and a NAND flash memory 105.

The TSV is an electrode that penetrates the memory chip 100 in an up-down direction and is used to transfer the power supply voltage VCC to the interface chip 101 or to another memory chip 100, or transmit and receive control signals, data signals, etc.

In each of the memory chips 100, circuits are formed on a silicon substrate, and an interlayer insulating layer is formed on the silicon substrate so as to cover the circuits. A pad functioning as a terminal connected to an external device is provided on the interlayer insulating layer. In such a configuration, the TSV may be provided so as to penetrate the silicon substrate and the interlayer insulating layer. In this case, through the TSV, the pad on the interlayer insulating layer is connected directly to a pad provided on a back surface of the silicon substrate. In another configuration, it is also preferable that the TSV penetrates the silicon substrate and does not penetrate the interlayer insulating layer. In this case, the TSV is electrically connected to the pad on the interlayer insulating layer via a wiring layer provided in the interlayer insulating layer.

In the present embodiment, the TSV 10 is used to transfer the power supply voltage VCC applied by the controller to the memory chips 100. Specifically, the power supply voltage VCC from the controller is first applied to the TSV 10 in the memory chip 100-0 positioned in the lowermost layer (hereinafter referred to as the "bottom chip"). The power supply voltage VCC is subsequently transferred to the TSV 10 in the memory chip 100-15 at the uppermost position (hereinafter referred to as the "top chip") via the TSVs 10 in the memory chips 100-1 to 100-14. At the TSV 10, when the power supply voltage VCC is transferred, voltage drop occurs based on the product of a current flowing through the TSV 10 to the NAND flash memory 105 and a resistance value for the TSV 10. Thus, the power supply voltage VCC at the top chip 100-15 (hereinafter referred to as the "voltage ZVCC") is lowest.

Furthermore, the TSV 11, for example, transfers the voltage ZVCC at the top chip 100-15 to the memory chips 100. Almost no voltage drop occurs at the TSV 11, because only a current for voltage detection flows from the TSV 11 to the voltage detector 125.

One of a source or a drain of the transistor 12 is connected to the TSV 10, and the other is connected to the TSV 11. The transistor 12 electrically connects the TSV 10 and the TSV 11 in accordance with a signal T12 input to a gate of the transistor 12. In the present embodiment, the transistor 12 in the top chip 100-15 is set to an on state, and the transistors 12 in the other memory chips 100-0 to 100-14 are set to an off state. Therefore, the TSV 10 and the TSV 11 are electrically connected together by the top chip 100-15.

One of a source or a drain of the transistor 13 is connected to the TSV 11, and the other is connected to the voltage detector 125. The transistor 13 electrically connects the TSV 11 and the voltage detector 125 in accordance with a signal T13 input to a gate of the transistor 13.

The NAND flash memory 105 operates using the voltage VCC transferred via the TSV 10 as a power supply voltage to store data in a nonvolatile manner.

The voltage detector 125 detects the voltage ZVCC transferred by the TSV 11 to output a signal Sdtct according to a detection result to the NAND flash memory 105. FIG. 2 is a graph illustrating a voltage detection level for the voltage ZVCC. The voltage detector 125, for example, sets the signal Sdtct to an "L" level when the voltage ZVCC is equal to or higher than a detected voltage Vdtct and sets the signal Sdtct to an "H" level when the voltage ZVCC is lower than the detected voltage Vdtct. The voltage Vdtct is a voltage equal to or higher than the minimum voltage (VCC_min) and lower than the maximum voltage (VCC_max) within a guaranteed operation range of the NAND flash memory 105. The voltage Vdtct is more preferably set, for example, equal to or higher than the minimum voltage at which the NAND flash memory 105 is prevented from performing an erroneous write operation, an erroneous read operation, or the like due to a decrease in power supply voltage VCC.

1.2 Configuration of the NAND Flash Memory

Next, a configuration of the NAND flash memory 105 will be described.

Figure 3:
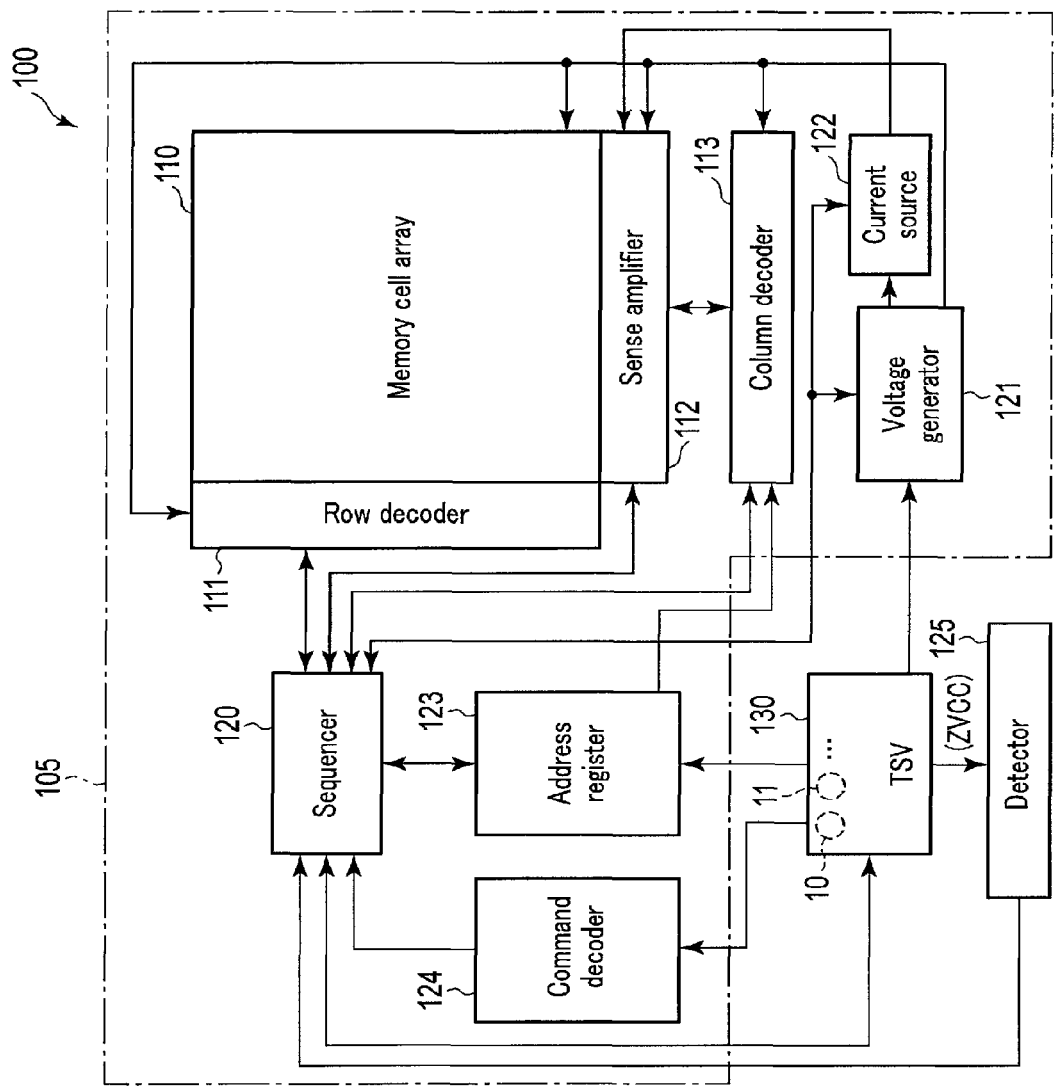
FIG. 3 is a block diagram of a memory chip provided in the semiconductor device of the embodiment.

FIG. 3 is a block diagram depicting an internal configuration of the memory chip 100. In FIG. 3, some of the connections between blocks are depicted by arrows, but the connections between the blocks are not limited to the illustrated connections. Moreover, the configurations of the memory chips 100-0 to 100-15 may be the same or different from one another. Furthermore, the memory chip 100 is connected to an external chip by a plurality of TSVs including the TSVs 10 and 11. Therefore, FIG. 3 depicts an area in which the TSVs and the transistors 12 and 13 are provided, as a TSV area 130.

As depicted in FIG. 3, the NAND flash memory 105 includes a memory cell array 110, a row decoder 111, a sense amplifier 112, a column decoder 113, a sequencer 120, a voltage generator 121, a current source 122, an address register 123, and a command decoder 124.

The memory cell array 110 includes a plurality of nonvolatile memory cell transistors. The memory cell transistors are connected to word lines and bit lines not depicted in the drawings. Any of the memory cell transistors is selected using the word lines and bit lines.

The address register 123 temporarily holds an address signal received from the controller via the TSV. The address register 123 then transfers a row address to the row decoder 111, and transfers a column address to the column decoder 113.

For example, at the time of data read and data write, the row decoder 111 decodes the row address and selects a word line in accordance with a decode result. The row decoder 111 then applies appropriate voltages to the selected word line and the un-selected word lines.

The sense amplifier 112 includes a plurality of sense amplifier units described below. The sense amplifier units are provided in association with the bit lines, and at the time of data read, senses data read from the memory cell transistor onto the bit line. Furthermore, at the time of data write, the sense amplifier 112 transfers write data to the memory cell transistor.

For example, at the time of data write and data read, the column decoder 113 decodes the column address and selects from the sense amplifier units in accordance with a decode result.

The command decoder 124 decodes a command signal received from the controller via the TSV.

The sequencer 120 controls the overall operation of the memory chip 100. Furthermore, the sequencer 120 controls the overall operation of the NAND flash memory 105 accordance with the decode result from the command decoder 124. Moreover, the sequencer 120 transmits a DAC signal to the current source 122 in accordance with the signal Sdtct received from the voltage detector 125.

The voltage generator 121 steps up or down the power supply voltage VCC supplied via the TSV 10 to generate a voltage needed to write, read, and erase data. The voltage generator 121 supplies voltages to the current source 122, the memory cell array 110, the row decoder 111, the sense amplifier 112, and the column decoder 113, etc., for example, via a driver not depicted in the drawings.

The current source 122 controls the possible maximum value of a current flowing from the voltage generator 121 through the sense amplifier in accordance with the DAC signal received from the sequencer 120. That is, the current source 122 controls a maximum value of a current capable of being supplied with the sense amplifier in accordance with the DAC signal received from the sequencer 120.

1.2.1 Configuration of the Memory Cell Array

Figure 4:
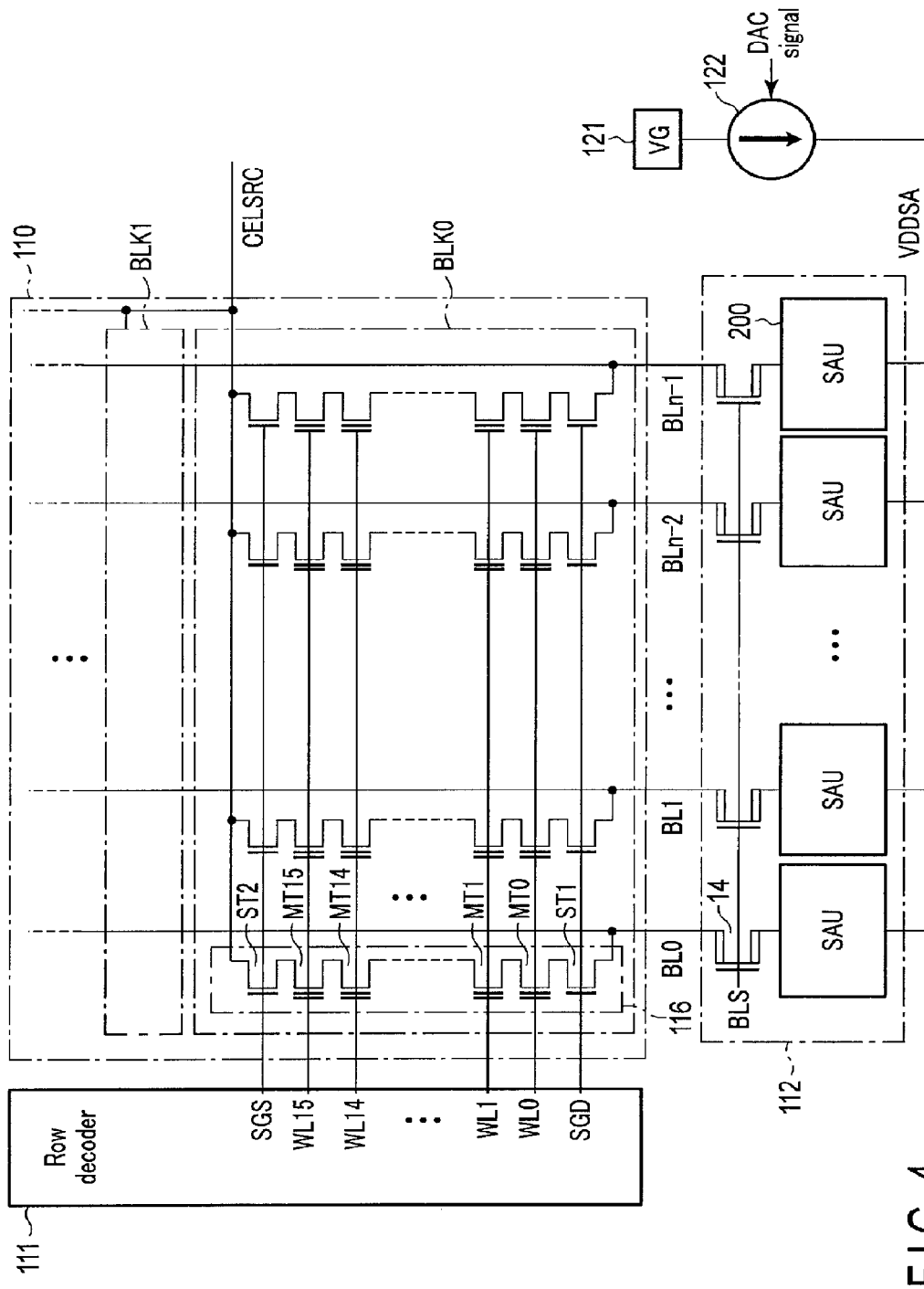
FIG. 4 is a circuit diagram of a memory cell array provided in the semiconductor device of the embodiment.

Next, a configuration of the memory cell array 110 will be described. FIG. 4 is a circuit diagram of the memory cell array 110.

As depicted in FIG. 4, the memory cell array 110 includes a plurality of blocks BLK (BLK0, BLK1, . . . ) each of which is a set of memory cell transistors MT.

Each of the blocks BLK includes a plurality of NAND strings 116 each including a plurality of memory cell transistors MT connected together in series. The memory cell transistors MT in the present embodiment are two-dimensionally arranged on a semiconductor substrate. Any number of NAND strings 116 may be included in one block.

Each of the NAND strings 116 includes, for example, 16 memory cell transistors MT (MT0 to MT15), a select transistor ST1, and a select transistor ST2. The memory cell transistor MT includes a control gate and a charge accumulation layer and holds data in a nonvolatile manner. The memory cell transistor may be of a MONOS type in which an insulating film is used as the charge accumulation layer, or of an FG type in which a conductive film is used as the charge accumulation layer. Moreover, the number of memory cell transistors is not limited to 16, but may be 8, 32, 64, 128, and so on. No limitation is imposed on the number of memory cell transistors MT.

The memory cell transistors MT0 to MT15 are connected together in series. A drain of the memory cell transistor MT0 at one end of the series connection is connected to a source of the select transistor ST1. A source of the memory cell transistor MT15 at the other end is connected to a drain of the select transistor ST2.

Gates of the select transistors ST1 in the same block BLK are all connected to the same select gate line SGD. Similarly, gates of the select transistors ST2 in the same block BLK are all connected to the same select gate line SGS.

Furthermore, control gates of the memory cell transistors MT0 to MT15 in the NAND strings 116 in the block BLK are connected to word lines WL0 to WL15, respectively.

Additionally, for the NAND strings 116 arranged in a matrix in the memory cell array 110, drains of the select transistors ST1 for the NAND strings 116 in the same column are connected to one of bit lines BL0 to BLn−1 (n is an integer of 0 or larger). That is, the bit line BL and NAND strings 116 in a plurality of blocks BLK arranged in the same column are connected together.

In addition, sources of the select transistors ST2 in each block BLK are all connected to a source line CELSRC. That is, the source line CELSRC connects the NAND strings 116 in a plurality of blocks BLK together.

The memory cell transistors may be two-dimensionally disposed on a semiconductor substrate and may be three-dimensionally stacked above the semiconductor substrate.

In addition, the configuration of the memory cell array 18 in the three-dimensional stack type NAND flash memory is disclosed in, for example, U.S. patent application Ser. No. 12/407,403, filed on Mar. 19, 2009, entitled "THREE DIMENSIONAL STACKED NONVOLATILE SEMICONDUCTOR MEMORY". In addition, it is disclosed in U.S. patent application Ser. No. 12/406,524, filed on Mar. 18, 2009, entitled "THREE DIMENSIONAL STACKED NON-VOLATILE SEMICONDUCTOR MEMORY", U.S. patent application Ser. No. 12/679,991, filed on Mar. 25, 2010, entitled "NON-VOLATILE SEMICONDUCTOR STORAGE DEVICE AND METHOD OF MANUFACTURING THE SAME", and U.S. patent application Ser. No. 12/532,030, filed on Mar. 23, 2009, entitled "SEMICONDUCTOR MEMORY AND METHOD FOR MANUFACTURING SAME". These patent applications are incorporated herein by reference in their entirety.

1.2.2 Configuration of the Sense Amplifier

Next, a configuration of the sense amplifier 112 will be described. The present embodiment will be described taking, as an example, the sense amplifier 112 that is based on a current sensing scheme and that senses a current flowing through the bit line BL. In the current sensing scheme in the present embodiment, data is read from all the memory cell transistors connected to one of the word lines WL in one of the blocks BLK (this unit is hereinafter referred to as a "page"). Therefore, the sense amplifier 112 in the present embodiment includes a sense amplifier unit 200 for each of the bit lines BL.

FIG. 5 is a circuit diagram of the sense amplifier 112. In an example in FIG. 5, a configuration corresponding to one bit line BL is illustrated. In the sense amplifier 112, the sense amplifier unit 200 is connected to the corresponding bit line BL via a high-withstand-voltage n-channel MOS transistor 14. A signal BLS is input to a gate of the transistor 14 and, for example, in the read operation and the write operation, the signal BLS is set to the "H" level and the on state. Consequently, the sense amplifier unit 200 is electrically connected to the corresponding bit line BL.

A voltage VDDSA from the voltage generator 121 is applied to the sense amplifier 112. Then, the current source 122 controls the possible maximum value of a current flowing from the voltage generator 121 through the sense amplifier 112, in accordance with the DAC signal received from the sequencer 120. Therefore, the current source 122 limits the current flowing from the sense amplifier 112 to the bit line BL. By way of example, the current source 122 may be a MOS transistor in which an output voltage from the voltage generator 121 is applied to one of a source or a drain, with the other connected to a power supply node of the sense amplifier unit 200, and in which a voltage based on the DAC signal is applied to a gate.

Furthermore, the sense amplifier unit 200 includes a sense circuit 210 and a latch circuit 220. FIG. 5 illustrates only one latch circuit 220, but a plurality of latch circuits may be provided. For example, a plurality of latch circuits is preferably provided when each memory cell transistor holds data of two or more bits.

The sense circuit 210 includes low-withstand-voltage n-channel MOS transistors 21 to 27, low-withstand-voltage p-channel MOS transistors 28 to 31, and a capacitor element 38. The transistors 21 to 27 have a lower withstand-voltage than the transistor 14. More specifically, gate insulating films in the transistors 21 to 27 are thinner than, for example, a gate insulating film in the transistor 14.

The signal BLC is input to a gate of the transistor 21, one of a source or a drain of the transistor 21 is connected to a node BL1, and the other is connected to a node COM2. The transistor 21 is intended to clamp the corresponding bit line BL to a voltage according to the signal BLC. A signal BLX is input to a gate of the transistor 22, and the voltage VDDSA is input to one of a source or a drain of the transistor 22, with the other connected to a node COM1.

A node LAT is connected to a gate of the transistor 23, and one of a source or a drain of the transistor 23 is connected to the node COM1, with the other connected to the node COM2. A node INV is connected to a gate of the transistor 28, and one of a source or a drain of the transistor 28 is connected to the node COM1, with the other connected to the node COM2. The transistors 23 and 28 serve as a first switch that switches on and off in accordance with data held in the latch circuit 220.

The node INV is connected to a gate of the transistor 24, and one of a source or a drain of the transistor 24 is connected to the node COM2, with the other connected to a node SRCGND. The node SRCGND transfers a voltage needed for the sense circuit 210, for example, a ground potential VSS. The node LAT is connected to a gate of the transistor 29, and one of a source or a drain of the transistor 29 is connected to the node COM2, with the other connected to the node SRCGND. The transistors 24 and 29 serve as a second switch that switches on and off in accordance with the data held in the latch circuit 220.

A signal HLL is input to a gate of the transistor 25, and the voltage VDDSA is applied to one of a source or a drain of the transistor 25, with the other connected to a node SEN. A signal XXL is input to a gate of the transistor 26, one of a source or a drain of the transistor 26 is connected to the node SEN, and the other is connected to the node COM1. One electrode of the capacitor element 38 is connected to the node SEN, and a clock CLK is input to the other electrode of the capacitor element 38. A signal STBn is input to a gate of the transistor 30, and the voltage VDDSA is applied to one of a source or a drain of the transistor 30, with the other connected to one of a source or a drain of the transistor 31. The node SEN is connected to a gate of the transistor 31, and the other of the source or drain of the transistor 31 is connected to the node INV. A signal RST_N is input to a gate of the transistor 27, one of a source or a drain of the transistor 27 is connected to the node INV, and the other is connected to a bus LBUS.

Next, the latch circuit 220 will be described. The latch circuit 220 includes low-withstand-voltage n-channel MOS transistors 32 to 34 and low-withstand-voltage p-channel MOS transistors 35 to 37.

A signal RST_P is input to a gate of the transistor 35, and the voltage VDDSA is applied to one of a source or a drain of the transistor 35, with the other connected to one of a source of a drain of the transistor 36. The node LAT is connected to a gate of the transistor 36, and the other of the source or drain of the transistor 36 is connected to the node INV. The node LAT is connected to a gate of the transistor 32, and one of a source or a drain of the transistor 32 is connected to the node INV, with the other connected to one of a source or a drain of the transistor 33. The signal STBn is input to a gate of the transistor 33, and the other of the source or drain of the transistor 33 is grounded. The node INV is connected to a gate of the transistor 37, and one of a source or a drain of the transistor 37 is connected to the power supply, with the other connected to the node LAT. The node INV is connected to a gate of the transistor 34, and one of a source or a drain of the transistor 34 is connected to the node LAT, with the other grounded.

In the latch circuit 220, the transistors 32 and 36 form a first inverter, and the transistors 34 and 37 form a second inverter. The node INV is connected to an output of the first inverter and to an input of the second inverter. The node LAT is connected to an input of the first inverter and to an output of the second inverter. Therefore, the latch circuit 220 holds data in the node LAT and holds an inverted version of the data in the node INV.

Operations of the first and second switches in the write operation will be described in brief. When, for example, data is written to the memory cell transistor MT (a charge is injected into the memory cell transistor MT to increase a threshold for the memory cell transistor MT), the node LAT in the latch circuit 220 is provided with an "L" level, and the node INV in the latch circuit 220 is provided with an "H" level. As a result, the transistors 23 and 28, serving as the first switch, are set to the off state, and the transistors 24 and 29, serving as the second switch, are set to the on state. For example, VSS from the node SRCGND is applied to the bit line BL (the corresponding bit line is hereinafter referred to as "BL_prog").

On the other hand, when no data is written to the memory cell transistor MT (almost no charge is injected into the memory cell transistor MT, causing almost no change in the threshold for the memory cell transistor MT), the node LAT in the latch circuit 220 is provided with the "H" level, and the node INV in the latch circuit 220 is provided with the "L" level. As a result, the transistors 23 and 28, serving as the first switch, are set to the on state, and the transistors 24 and 29, serving as the second switch, are set to the off state. A positive voltage (for example, the voltage resulting from clamping of the voltage VDDSA by the transistor 21) is applied to the bit line BL (the corresponding bit line is hereinafter referred to as "BL_inhibit").

2. Write Operation

Next, a write operation in the NAND flash memory 105 will be specifically described focusing particularly on operations of one memory chip 100. The write operation in the present embodiment includes a program operation in which electrons are injected into the charge accumulation layer to raise the threshold voltage of the memory cell transistor MT and a verify operation that involves determining whether or not the threshold voltage has reached a target value as a result of the program operation. The sequencer 120 selects, in the program operation, the normal mode or the low current mode based on the signal Sdtct received from the voltage detector 125.

The normal mode is a mode in which the current source 122 does not limit the possible maximum value of the current flowing through the sense amplifier 112, or sets a current value larger than the current value in the low current mode described below. Furthermore, the low current mode is a mode in which the current source 122 controls the possible maximum value of the current flowing through the sense amplifier 112 such that the possible maximum value is smaller than the current set value set in the normal mode.

Furthermore, a difference in the current consumption of the memory chip 100 between the normal mode and the low current mode will be described in brief. The difference will be described below, taking as an example a case where the current consumption is maximized in the program operation.

FIG. 6 is a graph illustrating an example of the current consumption of the memory chip 100 in the program operation. As depicted in FIG. 6, when the current consumption of each memory chip 100 (for example, a current flowing from the TSV 10 to the NAND flash memory 105) is denoted as Icc, the current consumption is maximized in an initial phase of the program operation. In the low current mode, the current source 122 limits the current flowing through the sense amplifier 112, that is, the current flowing from the sense amplifier 112 through the bit line BL, in accordance with the DAC signal received from the sequencer 120. Therefore, in the low current mode, the maximum value of the current consumption Icc is reduced. Thus, when a peak current value in the normal mode is denoted as Icc_x and a peak current value in the low current mode is denoted as Icc_y, a relation Icc_x>Icc_y is observed.

2.1 General Flow of the Write Operation

Figure 7:
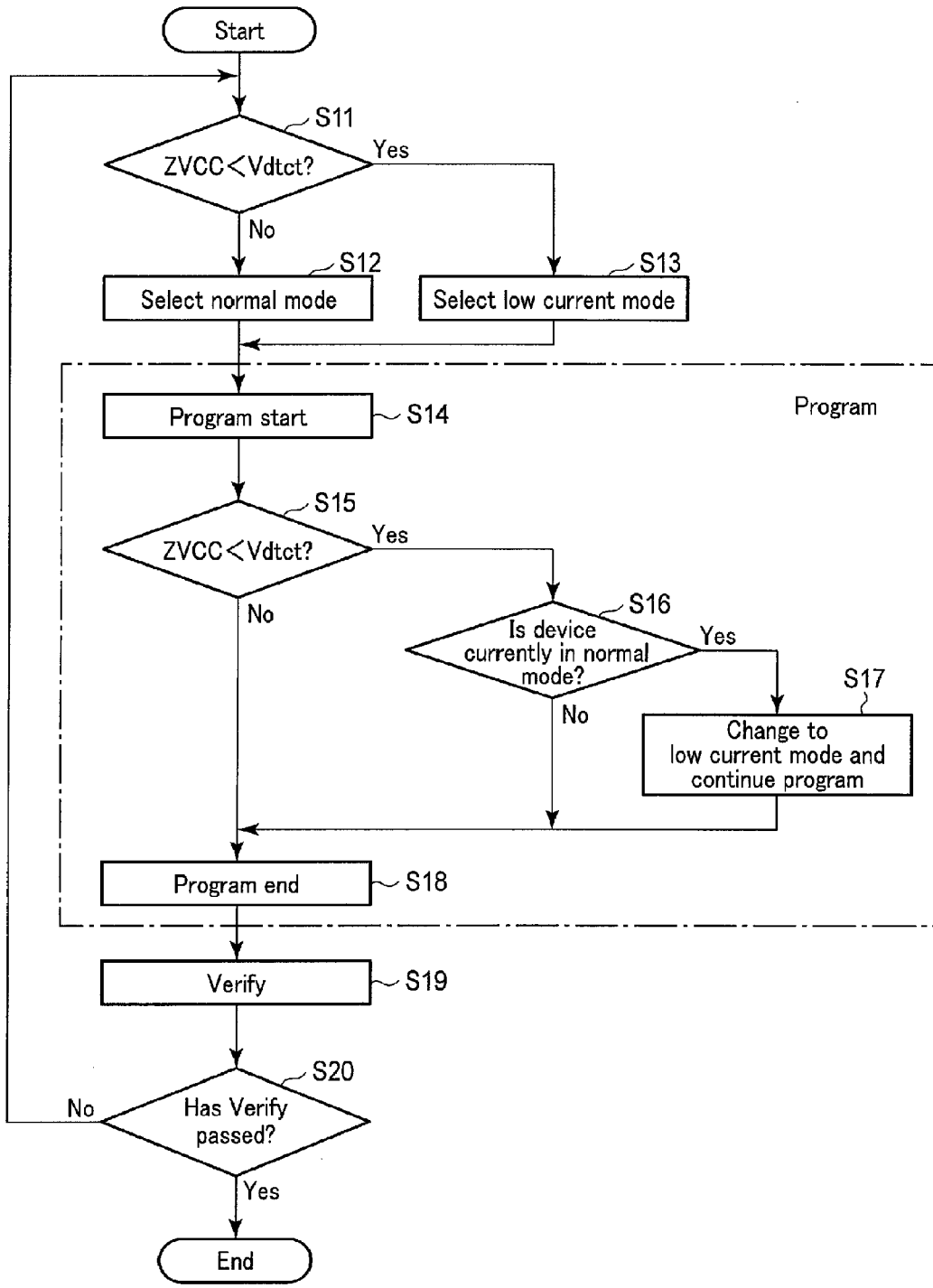
FIG. 7 is a flowchart of a write operation in the semiconductor device of the embodiment.

FIG. 7 is a flowchart illustrating the details of a write operation. First, upon receiving a write instruction from the controller, the sequencer 120 checks whether or not the power supply voltage ZVCC at the top chip 100-15 is lower than the voltage Vdtct. Specifically, the sequencer 120 checks the signal Sdtct (step S11).

When the voltage ZVCC is equal to or higher than the voltage Vdtct (step S11_No), that is, when the signal Sdtct is at the "L" level, the sequencer 120 selects the normal mode (step S12).

On the other hand, when the voltage ZVCC is lower than the voltage Vdtct (step S11_Yes), that is, when the signal Sdtct is at the "L" level, the sequencer 120 selects the low current mode (step S13).

Then, the sequencer starts the program operation (step S14).

The sequencer 120 constantly checks whether or not the voltage ZVCC is lower than the voltage Vdtct while the program operation is being executed (step S15).

When no decrease in voltage ZVCC (ZVCC<Vdtct) is detected (step S15_No), the sequencer 120 ends the program operation without ending the normal mode or the low current mode (step S18). That is, when the low current mode has already been selected, the sequencer 120 does not change to the normal mode even when the voltage ZVCC recovers to the voltage Vdtct or higher. When the low current mode has been selected, the sequencer 120 switches to the normal mode when the program operation ends.

After the program operation ends, the sequencer 120 executes a verify operation (step S19). Upon failing in the verify operation (step S20_No), the sequencer 120 returns to step S11 to repeat the program operation and the verify operation until the verify operation succeeds (step S20_Yes), or a preset upper limit number of times is reached. Then, when the verify operation succeeds, the write operation ends normally. A series of operations including the program operation and the verify operation is hereinafter referred to as a "program loop".

Then, a case where a decrease in the voltage ZVCC is detected in the program operation (step S15_Yes) will be described. When the normal mode has been selected (step S16_Yes), the sequencer 120 changes the normal mode to the low current mode and continues the program operation (step S17). On the other hand, when the low current mode has already been selected (step S16_No), the sequencer 120 continues the program operation.

In the present embodiment, the case has been described where a change from the low current mode to the normal mode is not made in the program operation. However, a change to the normal mode may be made.

2.2 Voltages of the Interconnects in the Program Operation

Next, the voltages of the interconnects and signals in the program operation will be described.

2.2.1 Case of the Normal Mode

Figure 8:
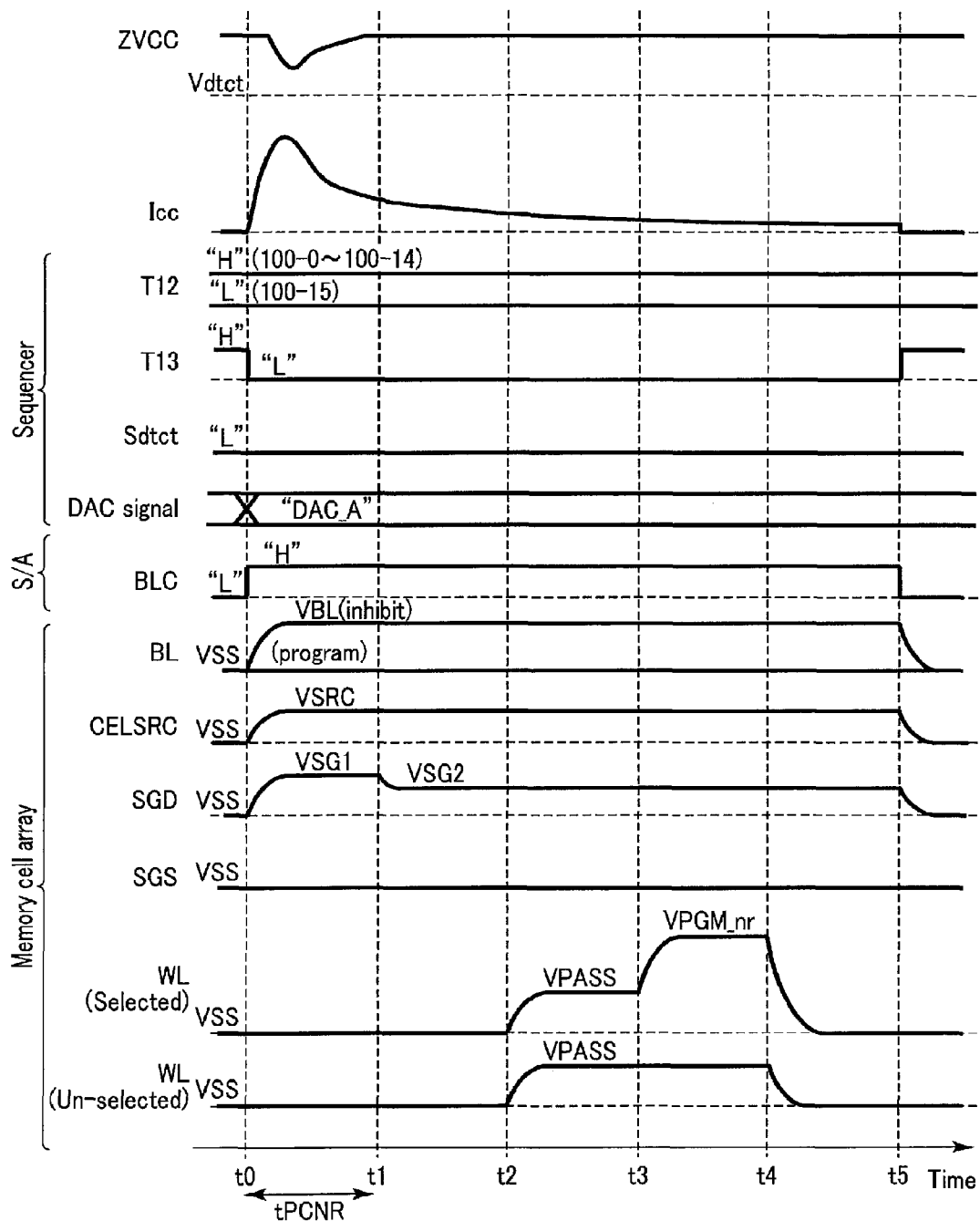
FIG. 8 is a timing chart illustrating voltages of interconnects obtained when the program operation is performed in a normal mode in the semiconductor device of the embodiment.

First, the case of the normal mode will be described. FIG. 8 is a timing chart illustrating the voltages of the interconnects and signals resulting from the program operation in the normal mode. If, for example, the voltage ZVCC at the top chip 100-15 is detected, then in the top chip 100-15, the signal T12 is at the "L" level and the transistor 12 is in the on state. On the other hand, in the memory chips 100-0 to 100-14, the signal T12 is at the "H" level and the transistor 12 is in the off state. That is, the TSV 10, which transfers the power supply voltage VCC, and the TSV 11, which transfers the voltage ZVCC, are connected together at the top chip 100-15.

First, at time t0, the sequencer 120 sets the signal T13 to the "L" level and sets the transistor 13 to the on state. The transistor 13 may be in a normally-on state. The sequencer 120 checks the result of detection of the voltage ZVCC by the voltage detector 125, that is, confirms that the signal Sdtct is at the "L" level. The sequencer 120 transmits the DAC signal "DAC_A" to the current source 122. The DAC signal "DAC_A" is a current setting signal in the normal mode. Based on the DAC signal "DAC_A", the current source 122 does not limit the possible maximum value of the current, or sets a current value larger than the current value in the low current mode. In this state, the voltage generator 121 applies a voltage VSRC (>VSS) to the source line CELSRC, and the row decoder 111 applies the voltage VSS to the select gate line SGS. Consequently, the select transistor ST2 is set to a cutoff state. Moreover, the row decoder 111 applies a voltage VSG1 (>VSS) to the select gate line SGD to set the select transistor ST1 to the on state. The sequencer 120 then sets the signal BLC to the "H" level to set the transistor 21 in the sense circuit 210 to the on state. The sense amplifier 112 applies the voltage VSS to the bit line BL_prog, and applies the voltage VBL to the bit line BL_inhibit. Thus, the bit line BL_inhibit is charged to the voltage VBL (this charging operation is hereinafter referred to as "bit line pre-charge"). Additionally, the period of bit line pre-charge between time t0 and time t1 in the normal mode is denoted as tPCNR.

For example, in the NAND flash memory 105, a large current flows from the sense amplifier 112 to the bit line BL at the time of the bit line pre-charge. Accordingly, in the bit line pre-charge, the current Icc is maximized and the voltage drop of the power supply voltage VCC increases. Therefore, the voltage ZVCC also decreases significantly, but in the example in FIG. 8, remains higher than the voltage Vdtct. Consequently, the sequencer 120 does not change the normal mode to the low current mode.

Then, at time t1, the row decoder 111 applies a voltage VSG2 to the select gate line SGD. The voltage VSG2 is a voltage at which the select transistor ST1 corresponding to the bit line BL_prog is set to the on state and at which the select transistor ST1 corresponding to the bit line BL_inhibit is set to the off state. Consequently, the NAND string 116 corresponding to the bit line BL_inhibit is set to a floating state.

Then at time t2, the row decoder 111 applies a voltage VPASS to the selected and un-selected word lines WL. The voltage VPASS is a voltage that, in the write operation, sets the memory cell transistor to the on state regardless of the threshold for the memory cell transistor MT, while preventing an erroneous write operation to the un-selected memory cell transistors MT.

Then, at time t3, the row decoder 111 applies a voltage VPGM to the selected word line WL. The voltage VPGM is a high positive voltage that allows a charge to be injected into the charge accumulation layer, and has a relation VPGM>VPASS. Thus, a charge is injected into the charge accumulation layer in the write target memory cell transistor MT connected to the selected word line WL. On the other hand, no charge is injected into the charge accumulation layer in the non-write-target memory cell transistor MT connected to the selected word line WL because capacitive coupling to VPGM raises a channel potential.

Then, at time t4 to t5, a recovery operation is conducted to reset the interconnects.

2.2.2 Case of the Low Current Mode

Figure 9:
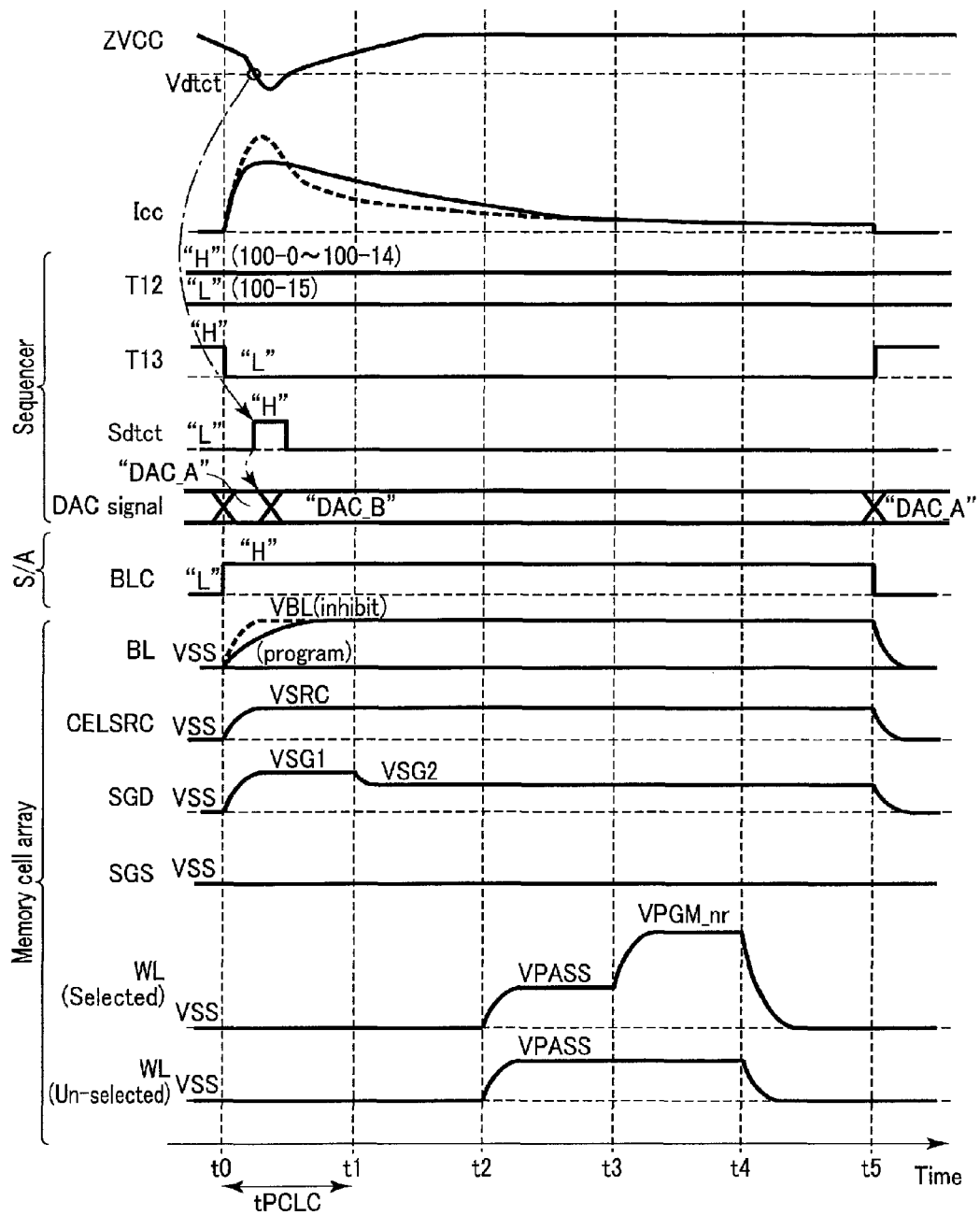
FIG. 9 is a timing chart illustrating the voltages of the interconnects obtained when the normal mode is changed to a low current mode in the program operation in the semiconductor device of the embodiment.

The case of the low current mode will be described. FIG. 9 is a timing chart illustrating the voltages and signals in the interconnects resulting from a change from the normal mode to the low current mode in the program operation. Only differences from the case where the program operation is executed in the normal mode as described with reference to FIG. 8 will be described.

First, at time t0, the sequencer 120 has selected the normal mode, and thus, the voltages of the interconnects and signals are the same as the voltages and signals in FIG. 8. Then, between time t0 and time t1, when the voltage ZVCC decreases below the voltage Vdtct in the bit line pre-charge, the signal Sdtct is set to the "H" level. In response to the signal Sdtct, the sequencer 120 transitions to the low current mode and transmits the DAC signal "DAC_B" to the current source 122. The DAC signal "DAC_B" is a current setting signal in the low current mode, and the current source 122 controls the possible maximum value of the current in accordance with the DAC signal "DAC_B". As a result, the peak current value of the current Icc is lower than that in the normal mode. When the voltage ZVCC is equal to or higher than the voltage Vdtct, the signal Sdtct is set to the "L" level. However, the sequencer 120 maintains the low current mode.

When the bit line is pre-charged in the low current mode, the current source 122 limits the current flowing from the sense amplifier 112 through the bit line BL. Thus, the maximum value of the current consumption Icc is lower than that in the normal mode. However, the charging capacity of the bit line BL remains the same, and thus, a pre-charge time is extended (charging speed is reduced) as a result of the limitation of the current flowing from the sense amplifier 112 through the bit line BL. Consequently, when the period of the bit line pre-charge in the low current mode is denoted as tPCLC, then tPCLC≥tPCNR. Therefore, when the program operation is executed in the low current mode, the program time may be extended compared to the program time in the normal mode.

Operations at time t1 and subsequent points in time are similar to the corresponding operations in the normal mode and are not substantially affected by the limitation of the current. Thus, a period needed for the operation at each point in time may be the same as the corresponding period in the normal mode.

2.3 Specific Example of the Current Icc in the Write Operation

Next, a specific example of changes in the current Icc in repetition of the program loop will be described.

Figure 10:
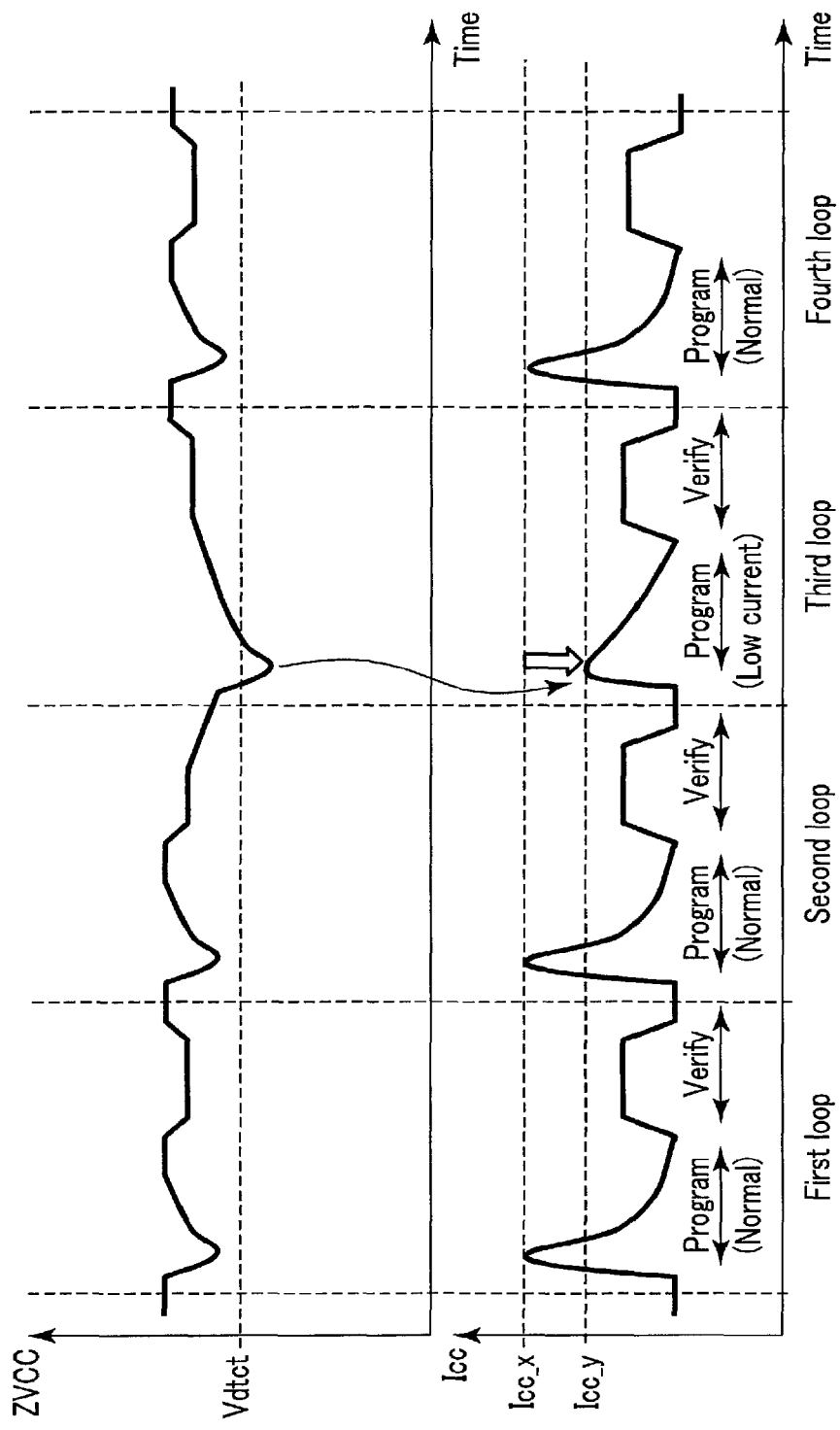
FIG. 10 is a timing chart illustrating the relation between a voltage ZVCC and the current consumption in the write operation in the semiconductor device of the embodiment.

FIG. 10 is a graph illustrating an example of the voltage ZVCC and the current Icc in the write operation.

First, in the first program loop, the sequencer 120 executes the program operation in the normal mode because the voltage ZVCC is equal to or higher than the voltage Vdtct. At this time, the current Icc has a current value Icc_x and is maximized in the program operation. This also applies to the second and subsequent program operations.

Then, in the third program loop, the voltage ZVCC decreases below the voltage Vdtct under the effect of a voltage drop in another memory chip 100. Thus, the sequencer 120 executes the program operation in the low current mode. At this time, the current Icc is limited so as to have a current value Icc_y or smaller. In the verify operation, the maximum current is equal to or smaller than Icc_y, and thus, the current Icc is not limited.

Then, in the fourth program loop, the voltage ZVCC is equal to or higher than the voltage Vdtct, and thus, the sequencer 120 executes the program operation in the normal mode, as is the case with the first and second program loops.

3 Effects of the Present Embodiment

The configuration according to the present embodiment allows the operational reliability of the semiconductor device 1 to be improved. This effect will be described below.

In a semiconductor device using a three-dimensional implementation technique for stacking memory chips with TSVs, the power supply voltage VCC supplied to each memory chip is transferred via the TSV. When the power supply voltage VCC is transferred from the bottom to top of the stacked memory chips, the top chip located at the uppermost position is a chip that is most distant from the power supply, namely, a chip with the longest TSV through which the power supply voltage VCC is transferred to the chip. Thus, due to the resistance of the TSV, the resistance from the DC power supply to the top chip is the highest. When current is consumed by each memory chip, higher memory chips have smaller values of the power supply voltage VCC. Consequently, the top chip has the smallest value of the power supply voltage VCC. A reduced value of the power supply voltage VCC may cause the memory chip to execute an erroneous write operation or an erroneous read operation or preclude the memory chip from operating.

As a method for reducing the current consumption of each chip, for example, a method is available in which the controller executes control so as to stagger timings when the current consumption of each memory chip is maximized, thus reducing the total current consumptions of all the memory chips (this method is hereinafter referred to as "peak current control").

The peak current control is described in, for example, U.S. patent application Ser. No. 13/226,180 entitled "Memory System having Nonvolatile Semiconductor Memories", filed on Sep. 6, 2011. The entirety of the patent application is incorporated herein by reference. However, for the peak current control, the controller needs to stagger operation start timings for the memory chips, leading to latency. Thus, the semiconductor device as a whole may need an extended operation time.

Furthermore, in another possible method, for example, the controller controls the current consumption of each memory chip. In this case, the memory chip fails to accept a command input in a busy state (for example, an operating state such as write operation), and thus, the current mode can be selected only before the start of the write operation. Consequently, when the controller pre-instructs the memory chip to execute the write operation with the current consumption limited, a program operation with an extended operation time (for example, extended bit line pre-charge time) is executed in all the program loops in the write operation. This causes the write operation to be significantly delayed. Moreover, when the controller controls the current consumption of all the memory chips, the operating state of each memory chip needs to be determined. Specifically, for example, in the write operation, the details of the operation such as which of the program operation and the verify operation is being executed needs to be determined. This increases the number of signals transmitted and received between the controller and the memory chips, complicating the operation of the controller.

In contrast, the configuration according to the present embodiment allows each memory chip 100 to monitor the voltage ZVCC at the top chip 100-15. Then, when the voltage ZVCC decreases below the detected voltage Vdtct, each memory chip changes to the low current mode in which the current consumption is limited in program operations with high current consumption. Consequently, the total current consumption of the memory chips can be reduced to suppress the voltage drop of the power supply voltage VCC. Therefore, a possible malfunction and shutdown of the top chip 100-15 can be inhibited, allowing the operational reliability to be improved. A specific example of the present effect will be described.

Figure 11:
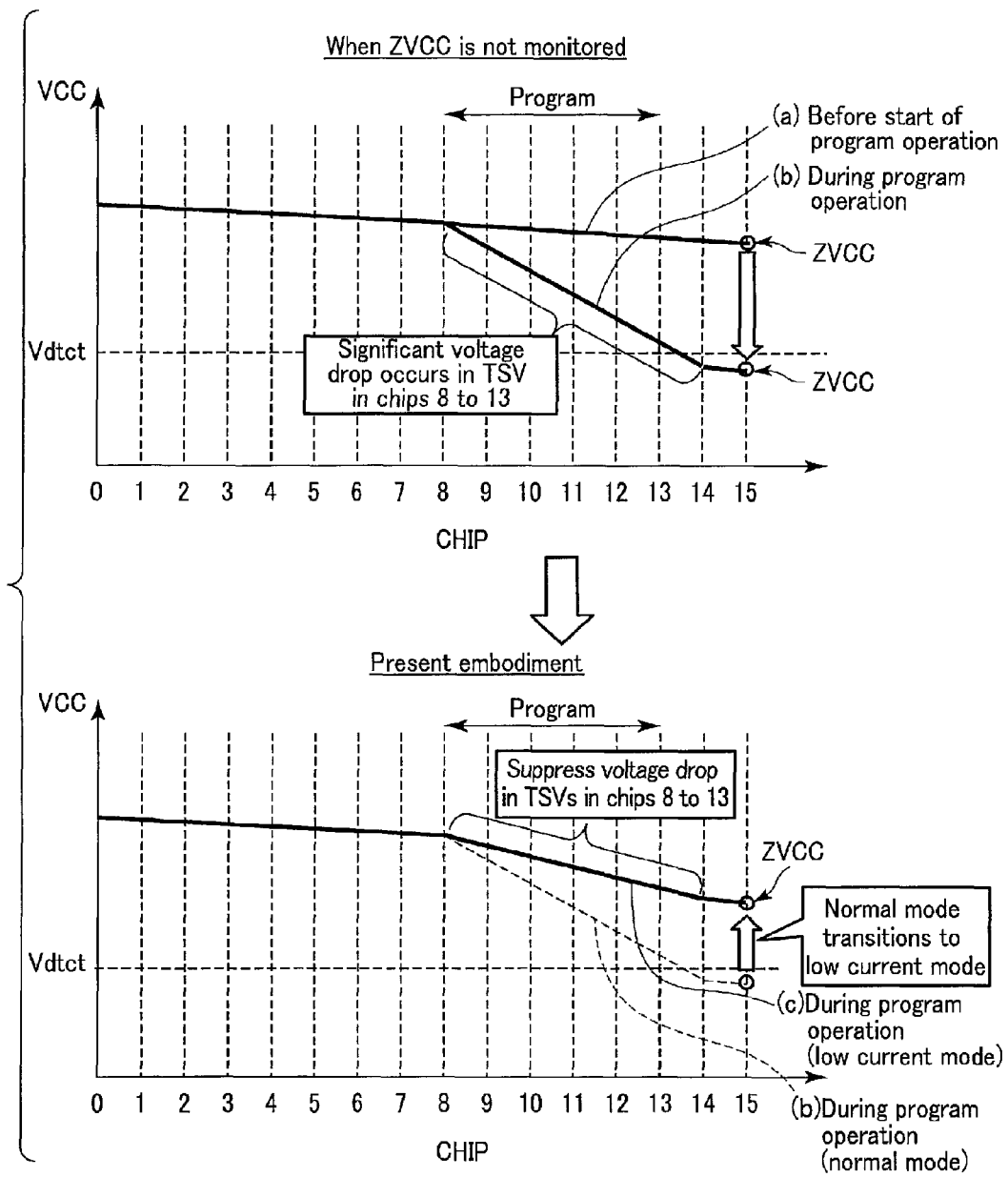
FIG. 11 is a graph illustrating an example of the voltage value of a power supply voltage VCC in each memory chip in the semiconductor device of the embodiment.

FIG. 11 is a graph illustrating an example of the value of the power supply voltage VCC in each memory chip. In the example in FIG. 11, the memory chips 100-8 to 100-13 simultaneously execute the program operation, and the current consumption simultaneously reaches a peak in all of the memory chips 100-8 to 100-13. First, a case where the memory chip 100 does not monitor the voltage ZVCC will be described using an upper part of FIG. 11. Before the program operation is started (graph (a)), the voltage ZVCC is higher than the voltage Vdtct. When the sequencer 120 in each of the memory chips 100-8 to 100-13 executes the program operation in the normal mode (graph (b)), the voltage drop of the power supply voltage VCC caused by the memory chips 100-8 to 100-13 increases. Thus, the voltage ZVCC decreases below the voltage Vdtct.

Next, a case where the present embodiment is applied will be described using a lower part of FIG. 11. Upon confirming, before the start of a program operation, that the voltage ZVCC is higher than the voltage Vdtct, the sequencer 120 in each of the memory chips 100-8 to 100-13 starts the program operation in the normal mode (graph (b)). Then, upon detecting that the voltage ZVCC has decreased below the voltage Vdtct, the sequencer 120 in each of the memory chips 100-8 to 100-13 transitions to the low current mode and continues the program operation (graph (c)). Thus, the current consumption of the memory chips 100-8 to 100-13 is reduced to suppress the voltage drop, making the voltage ZVCC equal to or higher than the voltage Vdtct. Consequently, a possible malfunction and shutdown, of the top chip 100-15 in particular can be inhibited, allowing improvement in the operational reliability of the semiconductor device 1.

Furthermore, if, for example, 16 memory chips 100 simultaneously execute the program operation, when the current consumption in the normal mode is assumed to have a maximum value Icc_x of 10 mA, the total current consumption of the 16 memory chips has a maximum value of 160 mA. In contrast, when the current consumption in the low current mode is assumed to have a maximum value Icc_y of 5 mA, the total current consumption of the 16 memory chips can be reduced, for example, down to approximately 80 mA. Consequently, the voltage drop of the power supply voltage VCC is suppressed to enable a possible malfunction and shutdown of the memory chips to be inhibited, allowing the operational reliability to be improved.

Moreover, the configuration according to the present embodiment monitors the voltage ZVCC to control the current consumption of each memory chip 100. Thus, compared to a configuration where the controller executes control, the configuration according to the present embodiment allows for a quicker response to a decrease in voltage ZVCC.

Moreover, since the sequencer 120 executes the control, a change to the low current mode can be made even in the write operation. Furthermore, when, for example, a plurality of program loops is repeated in the write operation, it is possible that the current consumption of the program operation is suppressed only when the voltage ZVCC is lower than the voltage Vdtct. Therefore, the extension of the program time resulting from the suppression of the current consumption can be minimized.

Moreover, in the configuration according to the present embodiment, each memory chip independently controls the current consumption. Consequently, the controller need not have a function to control the current consumption, and can thus be simply configured.

4. Modifications, Etc.

The semiconductor device according to the above-described embodiment includes: a first semiconductor chip (100 in FIG. 1) including a first via (10 in FIG. 1) and a second via (11 in FIG. 1); and a second semiconductor chip (100-15 in FIG. 1) including a third via (10 in FIG. 1) coupled to the first via and a fourth via (11 in FIG. 1) coupled to the second via (11 in FIG. 1) and the third via, the second semiconductor chip being located above the first semiconductor chip. The first semiconductor chip includes: a first detector (125 in FIG. 1) capable of coupling to the third via through the second and fourth vias; and a first current source (122 in FIG. 3) configured to control an output current in accordance with a voltage of the third via detected by the first detector.

Application of the above-described embodiment enables provision of a semiconductor device that allows reliability to be improved. The embodiment is not limited to the above-described form, but various modifications may be made to the embodiment.

For example, in the above-described embodiment, even in operations other than a program operation, the normal mode may be changed to the low current mode when the signal Sdtct changes to the "H" level. More specifically, the low current mode may be applied at the time of verify operation, and the low current mode may be applied in a read operation or a erase operation. Moreover, for voltages other than the voltage VDDSA, the current may be limited. Specifically the current for pre-charging the word line WL may be limited, for example, in the write, read, or erase operation.

Moreover, in the above-described embodiment, a sense amplifier unit based on a voltage sense scheme may be used.

Furthermore, in the above-described embodiment, the current source 122 is provided in order to limit the current of the voltage VDDSA. However, the current may be suppressed, for example, by the sense amplifier 112 by, for example, ramping up the signal BLC to reduce a step-up speed for the bit line BL_inhibit below the corresponding step-up speed in the normal mode.

Moreover, in the above-described embodiment, the signal Sdtct may be, for example, at the "H" level while the voltage ZVCC is equal to or lower than the voltage Vdtct.

The above-described embodiment may be applied to a three-dimensional stacked NAND flash memory with memory cell transistors stacked above a semiconductor substrate. Furthermore, the above-described embodiment may be applied to various types of memory chips whether volatile memories or nonvolatile memories. Additionally, the present embodiment may be applied to chips other than memory chips which are connected together by TSVs.

Moreover, the terms "connect" and "couple" include a state where certain objects are indirectly connected together with another object, for example, a transistor or a resistor interposed between the certain objects.

Each embodiment may be modified as follows. That is, each memory cell transistor MT can hold 2-bit (4-level) data. The four threshold levels holding 4 data levels, respectively, any one of which each transistor MT may hold, are "E" level (erase level), "A" level, "B" level and "C" level in ascending order.

(1) Read Operation

The voltage applied to any word line selected to read data at "A" level ranges, for example, from 0V to 0.55 V. The voltage range is not limited to this. The range may instead be 0.1 V to 0.24 V, 0.21 V to 0.31 V, 0.31 V to 0.4 V, 0.4 V to 0.5 V or 0.5 V to 0.55 V.

The voltage applied to any word line selected to read "B" level data ranges, for example, from 1.5V to 2.3 V. The range is not limited, nonetheless. The voltage may be 1.65 V to 1.8 V, 1.8 V to 1.95 V, 1.95 V to 2.1 V, or 2.1 V to 2.3 V.

The voltage applied to any word line selected to read "C" level data ranges, for example, from 3.0 V to 4.0 V. The range is not limited, nonetheless. The voltage may be 3.0 V to 3.2 V, 3.2 V to 3.4 V, 3.4 V to 3.5 V, 3.5 V to 3.6 V, or 3.6 V to 4.0 V.

The read operation time (tR) may be, for example, 25 μs to 38 μs, 38 μs to 70 μs, or 70 μs to 80 ρs.

(2) Write Operation

As stated above, the write operation includes the program and the verify operation. In the write operation, the voltage first applied to any selected word line in the program operation ranges, for example, from 13.7 V to 14.3 V. The range is not limited, nonetheless. The voltage may be, for example, 13.7 V to 14.0 V or 14.0 V to 14.6 V.

The voltage applied first to any odd-numbered word line selected to write data may be different from the voltage applied first to the even-numbered word line selected to write data.

The program may be ISSP (Incremental Step Pulse Program). In this case, the step-up voltage may be, for example, about 0.5 V.

The voltage applied to any un-selected word line may be, for example, 6.0 V to 7.3 V. The range is not limited to this. For example, the range may be 7.3 V to 8.4 V. Further, the voltage may be 6.0 V or less.

The pass voltage to apply may be changed in accordance with whether the un-selected word line is an odd-numbered word line or an even-numbered word line.

The write operation time (tProg) may be, for example, 1700 μs to 1800 μs, 1800 μs to 1900 μs, or 1900 μs to 2000 μs.

(3) Erase Operation

The voltage first applied to the well, which is made in the upper part of the semiconductor substrate and above which the memory cell is arranged, ranges, for example, from 12 V to 13.6 V. The range is not limited, nonetheless. The voltage may be, for example, 13.6 V to 14.8 V, 14.8 V to 19.0 V, 19.0 V to 19.8 V, or 19.8 V to 21 V.

The erase operation time (tErase) may be, for example, 3000 μs to 4000 μs, 4000 μs to 5000 μs, or 4000 μs to 9000 μs.

(4) Structure of the Memory Cell

Each memory cell includes a charge accumulation layer arranged on a tunnel insulation layer having thickness of 4 to 10 nm, which is provided on the semiconductor substrate (silicon substrate). The charge accumulation layer may be a stacked structure composed of an insulation film of SiN or SiON, having a thickness of 2 to 3 nm, and a polycrystalline silicon film having a thickness of 3 to 8 nm. A metal such as Ru may be added to the polycrystalline silicon. On the charge accumulation layer, an insulation layer is provided. This insulation layer is composed of, for example, a lower High-k film having a thickness of 3 to 10 nm, an upper High-k film having a thickness of 3 to 10 nm, and a silicon oxide film interposed between the lower and upper High-k films and having a thickness of 4 to 10 nm. The High-k films may be made of HfO, for example. The silicon oxide film can be thicker than the High-k films. Above the insulation layer, a control electrode 30 nm to 70 nm thick is formed. Between the insulation layer and the control electrode, a film is interposed, which has a thickness of 3 to 10 nm and is made of a material for adjusting the work function. The material for adjusting the work function may be a metal oxide such as TaO or metal nitride film such as TaN. The control electrode can be made of, for example, W.

Moreover, an air gap may be provided between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first semiconductor chip including a first via and a second via; and
   a second semiconductor chip including a third via coupled to the first via and a fourth via coupled to the second via and the third via, the second semiconductor chip being located above the first semiconductor chip,
   wherein the first semiconductor chip includes:
   a first detector capable of coupling to the third via through the second and fourth vias;
   a first current source configured to control an output current in accordance with a voltage of the third via detected by the first detector; and
   a first memory device configured to operate using a voltage of the first via as a power supply voltage,
   the second semiconductor chip includes:
   a second detector capable of coupling to the third via through the fourth via;
   a second current source configured to control an output current in accordance with the voltage of the third via detected by the second detector; and
   a second memory device configured to operate using the voltage of the third via as a power supply voltage,
   the first memory device includes:
   a first memory cell;
   a first bit line coupled to the first memory cell; and
   a first sense amplifier coupled to the first bit line and supplied with a current by the first current source, and
   in a write operation for the first memory cell, the first current source controls a maximum value of a current capable of being supplied with the first sense amplifier in accordance with the voltage of the third via detected by the first detector.

2. The device according to claim 1, wherein the write operation includes:
   a program operation; and
   a verify operation, and
   when, in the program operation, the first detector detects that the voltage of the third via has decreased below a first voltage, the first current source sets the maximum value lower than the maximum value obtained when the voltage of the third via is equal to or higher than the first voltage.

3. The device according to claim 2, wherein, when, in the program operation, the first detector detects that the voltage of the third via has increased to the first voltage or higher, the first current source maintains the maximum value without changing the maximum value.

4. The device according to claim 1, wherein the first memory device includes:
   a second memory cell; and
   a second bit line configured to couple the second memory cell with the first sense amplifier,
   in the write operation, a first voltage is applied to the first bit line, and a second voltage higher than the first voltage is applied to the second bit line, and
   a charging speed, at which the second bit line is charged to the second voltage, varies according to the voltage of the third via detected by the first detector.

5. The device according to claim 4, wherein the write operation includes:
   a program operation; and
   a verify operation, and
   when, in the program operation, the first detector detects that the voltage of the third via has decreased below a third voltage, the first current source sets the charging speed lower than the charging speed obtained when the voltage of the third via is equal to or higher than the third voltage.

6. The device according to claim 5, wherein, when, in the program operation, the first detector detects that the voltage of the third via has increased to the third voltage or higher, the first current source maintains the charging speed without changing the charging speed.

7. The device according to claim 1, wherein the write operation includes:
a program operation; and
a verify operation, and
the first detector is coupled to the third via in the program operation and is not coupled to the third via in the verify operation.

8. The device according to claim 1, wherein the device further includes a plurality of stacked semiconductor chips, and
the second semiconductor chip is a chip located at an uppermost position among a plurality of the chips.

9. The device according to claim 1, wherein the device sets a maximum value of a sum of current consumption of the first semiconductor chip and current consumption of the second semiconductor chip smaller than a sum of a maximum value of the current consumption of the first semiconductor chip and a maximum value of the current consumption of the second semiconductor chip without using peak current control.

10. A semiconductor device comprising a first semiconductor chip,
wherein the first semiconductor chip includes:
a first via;
a second via different from the first via;
a first detector capable of coupled to the second via; and
a first memory device configured to operate using a voltage of the first via as a power supply voltage,
the first memory device includes:
a first memory cell;
a first bit line coupled to the first memory cell; and
a first sense amplifier coupled to the first bit line; and
a first current source configured to supply a current to the first sense amplifier, and
in a write operation for the first memory cell, the first current source controls a maximum value of a current capable of being supplied with the first sense amplifier in accordance with a power supply voltage of the second via detected by the first detector.

11. The device according to claim 10, wherein the write operation includes:
a program operation; and
a verify operation, and
when, in the program operation, the first detector detects that the power supply voltage of the second via has decreased below a first voltage, the first current source sets the maximum value lower than the maximum value obtained when the power supply voltage is equal to or higher than the first voltage.

12. The device according to claim 11, wherein, when, in the program operation, the first detector detects that the power supply voltage of the second via has increased to the first voltage or higher, the first current source maintains the maximum value without changing the maximum value.

13. The device according to claim 10, wherein the first memory device includes:
a second memory cell; and
a second bit line configured to couple the second memory cell with the first sense amplifier, the write operation includes:
a program operation; and
a verify operation, and
in the program operation, a first voltage is applied to the first bit line, and a second voltage higher than the first voltage is applied to the second bit line, and
when the first detector detects that the power supply voltage of the second via has decreased below a third voltage, the first current source sets a charging speed at which the second bit line is charged to the second voltage, lower than the charging speed obtained when the power supply voltage is equal to or higher than the third voltage.

14. The device according to claim 10, further comprising a second semiconductor chip above the first semiconductor chip,
wherein the second semiconductor chip includes:
a third via coupled to the first via;
a fourth via coupled to the second via and the third via;
a second detector capable of coupling to the third via through the fourth via; and
a second memory device configured to operate using a voltage of the third via as a power supply voltage, and
the second memory device includes:
a second memory cell;
a second bit line coupled to the second memory cell;
a second sense amplifier coupled to the second bit line; and
a second power supply configured to supply a current to the second sense amplifier.

15. The device according to claim 14, wherein the device further includes a plurality of stacked semiconductor chips, and
the second semiconductor chip is a chip located at an uppermost position among a plurality of the chips.

16. The device according to claim 14, wherein, in a write operation for the second memory cell, the second current source controls a maximum value of a current capable of being supplied with the second sense amplifier in accordance with the voltage of the third via detected by the second detector.

17. A semiconductor device comprising:
an interface chip;
a first semiconductor chip including a first via connected to the interface chip and a second via and using a voltage of the first via as a power supply voltage; and
a plurality of second semiconductor chips, each including a third via and a fourth via and using a voltage of the third via as a power supply voltage; and
a third semiconductor chip electrically connected to the first via through the third vias of the second semiconductor chips and the second via through the fourth vias of the second chips, the third semiconductor chip configured to electrically connect the third via of a top one of the second semiconductor chips and the fourth via of the top one of the second semiconductor chips,
wherein the first via connect to functional circuit of the interface chip and the second via does not connect to any functional circuit in the interface chip.

18. The device according to claim 17, wherein the semiconductor device is configured to reduce a total current consumption to a pre-fixed amount.

19. The device according to claim 17, wherein each of the first semiconductor chip and the second semiconductor chips is configured to control a current consumption of each chip to keep a total current consumption of the semiconductor device under a pre-fixed amount.

20. The device according to claim 17, wherein the first semiconductor chip is configured to perform a normal program mode and a low current program mode.

21. The device according to claim 20, wherein when a total current consumption of the semiconductor device exceeds a pre-fixed amount, the first semiconductor chip is configured to perform the low current program mode.

22. The device according to claim 20, wherein the first semiconductor chip is configured to detect a voltage of the second via and perform the normal program mode or the low current program mode depending on the voltage of the second via.

23. The device according to claim 17, wherein each of the first semiconductor chip and the second semiconductor chips is configured to perform a normal program mode and a low current program mode.

24. The device according to claim 17, wherein the first semiconductor chip does not use a voltage of the second via as a power supply voltage.

25. A semiconductor memory device comprising:
a first semiconductor chip comprising a first nonvolatile memory circuit, a first via to receive a first voltage to drive the first nonvolatile memory circuit from a chip located below the first semiconductor chip, and a first supplemental via;
a second semiconductor chip comprising a second nonvolatile memory circuit, a second via to receive a second voltage to drive the second nonvolatile memory circuit from the first semiconductor chip located below the second semiconductor chip, and a second supplemental via;
a first pad located between the first semiconductor chip and the second semiconductor chip to connect the first via and the second via; and
a first supplemental pad located between the first semiconductor chip and the second semiconductor chip to connect the first supplemental via and the second supplemental via,
wherein the second via is coupled to the second supplemental via through a signal line formed in another semiconductor chip located above the second semiconductor chip, one side of the signal line being coupled to the second via and other side of the signal line being coupled to the second supplemental via, further wherein, the difference between the first voltage and the second voltage is configured to be larger than the difference between a voltage at the first supplemental via and a voltage at the second supplemental via.

26. The device according to claim 25, wherein the first semiconductor chip and the second semiconductor chip is configured to be control a current consumption of each chip to keep a total current consumption of the semiconductor memory device under a pre-fixed amount.

27. The device according to claim 25, wherein the first semiconductor chip is configured to perform a normal program mode and a low current program mode.

28. The device according to claim 27, wherein when a total current consumption of the semiconductor memory device exceeds a pre-fixed amount, the first semiconductor chip is configured to perform the low current program mode.

29. The device according to claim 27, wherein the first semiconductor chip is configured to detect a voltage of the first supplemental via and perform the normal program mode or the low current program mode depending on the voltage of the first supplemental via.

30. The device according to claim 25, wherein the first semiconductor chip and the second semiconductor chip are configured to perform a normal program mode and a low current program mode.

31. The device according to claim 25, wherein the first semiconductor chip does not use a voltage of the first supplemental via to drive the first nonvolatile memory circuit.

32. The device according to claim 25, further comprising:
a third semiconductor chip comprising a third nonvolatile memory circuit, a third via to receive a third voltage to drive the third nonvolatile memory circuit from a chip located below the third semiconductor chip, and a third supplemental via;
a second pad located between the second semiconductor chip and the third semiconductor chip to connect the second via and the third via; and
a second supplemental pad located between the second semiconductor chip and the third semiconductor chip to connect the second supplemental via and the third supplemental via,
wherein the third semiconductor chip is provided between the second semiconductor chip and the another semiconductor chip, the second via is coupled to the second supplemental via through the third via and the third supplemental via, further wherein the difference between the second voltage and the third voltage is configured to be larger than the difference between a voltage at the second supplemental via and a voltage at the third supplemental via.

* * * * *